United States Patent
Maltsev et al.

(10) Patent No.: US 7,924,956 B2
(45) Date of Patent: Apr. 12, 2011

(54) SYSTEM AND METHOD FOR COMPENSATION OF NON-LINEAR TRANSMITTER DISTORTION

(75) Inventors: Alexander Maltsev, Nizhny Novgorod (RU); Ali Sadri, San Diego, CA (US); Oleg Poldin, Nizhny Novgorod (RU); Alexander Maltsev, Jr., Nizhny Novgorod (RU)

(73) Assignee: Intel Corporation, Santa Clara, CA (US)

( * ) Notice: Subject to any disclaimer, the term of this patent is extended or adjusted under 35 U.S.C. 154(b) by 522 days.

(21) Appl. No.: 11/910,138

(22) PCT Filed: Mar. 31, 2005

(86) PCT No.: PCT/RU2005/000157
§ 371 (c)(1),
(2), (4) Date: Jun. 3, 2008

(87) PCT Pub. No.: WO2006/104408
PCT Pub. Date: Oct. 5, 2006

(65) Prior Publication Data
US 2009/0129257 A1    May 21, 2009

(51) Int. Cl.
*H03D 1/04* (2006.01)
(52) U.S. Cl. .................................. 375/346
(58) Field of Classification Search .......... 375/296–297, 375/340, 346, 348, 350; 455/63.1, 67.13, 455/114.2–114.3
See application file for complete search history.

(56) References Cited

U.S. PATENT DOCUMENTS

| | | | |
|---|---|---|---|
| 6,044,111 A | | 3/2000 | Meyer et al. |
| 6,205,170 B1 | * | 3/2001 | Nunez Leon De Santos et al. ................... 375/219 |
| 6,314,146 B1 | * | 11/2001 | Tellado et al. ............... 375/346 |
| 7,031,251 B2 | * | 4/2006 | Chen et al. .................... 370/208 |
| 7,324,601 B2 | * | 1/2008 | Kim .............................. 375/260 |
| 7,519,129 B2 | * | 4/2009 | Porter et al. .................. 375/285 |
| 7,720,175 B2 | * | 5/2010 | Yeon et al. .................... 375/297 |
| 2001/0000220 A1 | | 4/2001 | Polley et al. |
| 2001/0000703 A1 | * | 5/2001 | Nunez Leon De Santos et al. ................... 375/229 |
| 2004/0165524 A1 | | 8/2004 | Chen et al. |
| 2006/0215537 A1 | * | 9/2006 | Wu et al. ...................... 370/208 |

FOREIGN PATENT DOCUMENTS

WO       2006104408 A1    10/2006

* cited by examiner

*Primary Examiner* — Khanh C Tran
(74) *Attorney, Agent, or Firm* — Kacvinsky Daisak PLLC (57) ABSTRACT

A system, apparatus, method and article to provide compensation of non-linear transmitter distortion are described. The apparatus may include a receiver node (130) to receive information from a transmitter node (120). The receiver node (130) may include a clipping ratio estimation module (142) to determine parameters of non-linearity of a transmitter at the receiver node (130), a training signal predistortion block (150) to generate predistorted training symbols at the receiver node (130) using the parameters of non-linearity, and a channel equalization block (146) to performing linear equalization at the receiver node (130) using the predistorted training symbols. Other embodiments are described and claimed.

20 Claims, 7 Drawing Sheets

```
┌─────────────────────────────┐
│ DETERMINE PARAMETERS OF     │
│ NON-LINEARITY OF A          │
│ TRANSMITTER                 │
│ 402                         │
└─────────────────────────────┘
              │
┌─────────────────────────────┐
│ PREDISTORT TRAINING         │
│ SYMBOLS AT RECEIVER         │
│ 404                         │
└─────────────────────────────┘
              │
┌─────────────────────────────┐
│ PERFORM LINEAR              │
│ EQUALIZATION                │
│ 406                         │
└─────────────────────────────┘
              │
┌─────────────────────────────┐
│ CORRECT DATA SYMBOLS IN     │
│ THE FREQUENCY DOMAIN        │
│ 408                         │
└─────────────────────────────┘
```

SYSTEM AND METHOD FOR COMPENSATION OF NON-LINEAR TRANSMITTER DISTORTION

BACKGROUND

Modern wireless communication systems operating according to Institute of Electrical and Electronics Engineers (IEEE) standards may employ a spectrally efficient Orthogonal Frequency Division Multiplexing (OFDM) modulation technique. An OFDM signal includes of large number of independently modulated subcarriers and generally has a large peak-to-average power ratio (PAPR). This property of an OFDM signal results in the requirement of high linearity of a transmitter output power amplifier or exploiting different PAPR reduction and power amplifier linearization schemes at the transmitter side.

To improve performance of OFDM communications, the non-linearity of a power amplifier or the residual (non-compensated) non-linearity of a power amplifier employing a predistortion scheme at the transmitter side can be compensated at the receiver side. Existing techniques for performing non-linear equalization at the receiver side, however, are complex and not practical in many cases. Accordingly, there may be a need for improved techniques for compensation of non-linear transmitter distortions at the receiver side implemented by a system or within a network.

DETAILED DESCRIPTION

Figure 1:
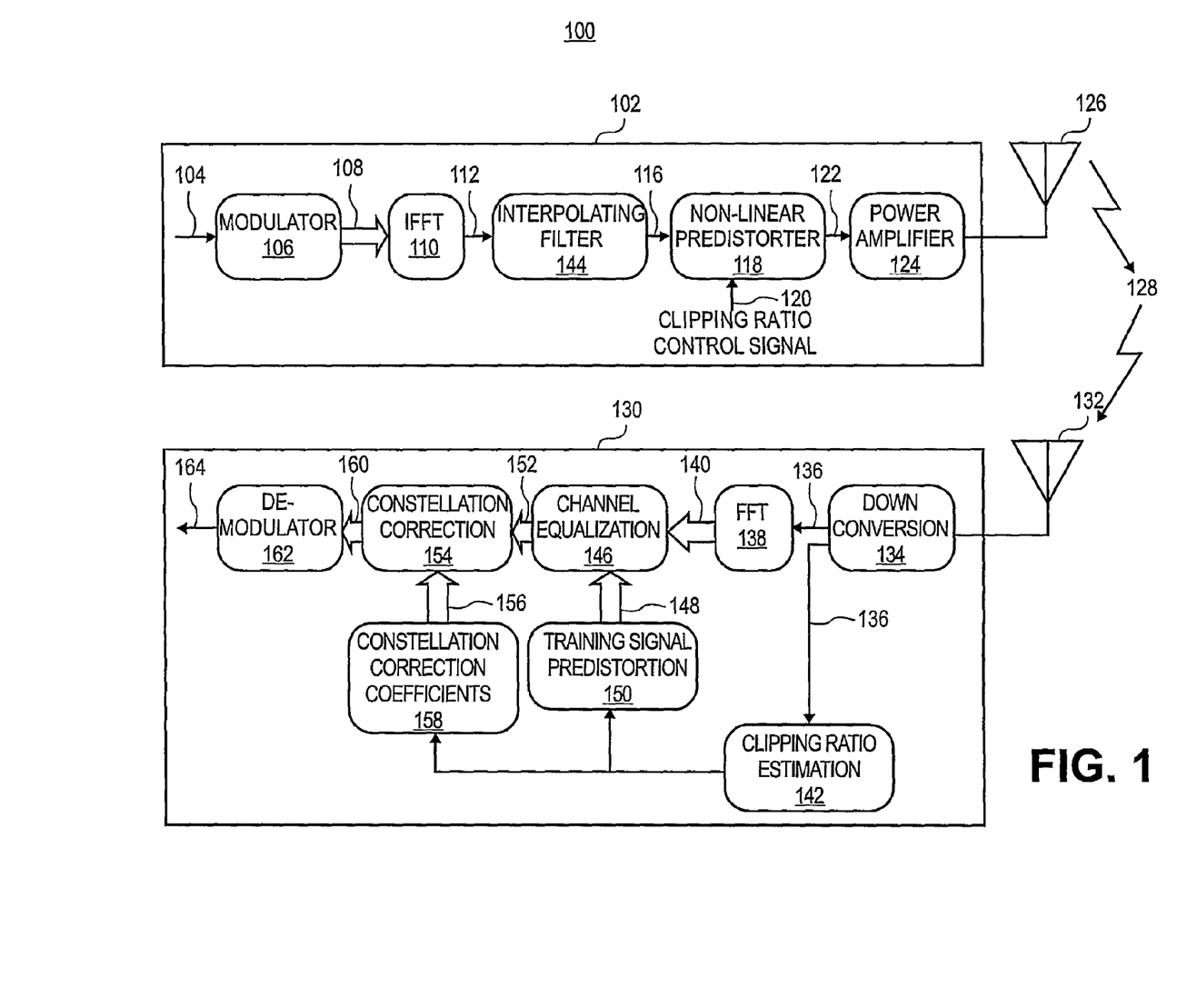
FIG. 1 illustrates one embodiment of a system.

FIG. 1 illustrates one embodiment of a system. FIG. 1 illustrates a block diagram of a system 100. The system 100 may comprise a communication system having multiple nodes. A node generally may comprise any physical or logical entity for communicating information in the system 100 and may be implemented as hardware, software, or any combination thereof, as desired for a given set of design parameters or performance constraints. Although FIG. 1 may show a limited number of nodes by way of example, it can be appreciated that more or less nodes may be employed for a given implementation.

In various embodiments, a node may comprise, or be implemented as, a computer system, a computer sub-system, a computer, an appliance, a workstation, a terminal, a server, a personal computer (PC), a laptop, an ultra-laptop, a hand-held computer, a personal digital assistant (PDA), a set top box (STB), a telephone, a mobile telephone, a cellular telephone, a handset, a wireless access point, a base station, a radio network controller (RNC), a mobile subscriber center (MSC), a microprocessor, an integrated circuit such as an application specific integrated circuit (ASIC), a programmable logic device (PLD), a processor such as general purpose processor, a digital signal processor (DSP) and/or a network processor, an interface, an input/output (I/O) device (e.g., keyboard, mouse, display, printer), a router, a hub, a gateway, a bridge, a switch, a circuit, a logic gate, a register, a semiconductor device, a chip, a transistor, or any other device, machine, tool, equipment, component, or combination thereof.

In various embodiments, a node may comprise, or be implemented as, software, a software module, an application, a program, a subroutine, an instruction set, computing code, words, values, symbols or combination thereof. A node may be implemented according to a predefined computer language, manner or syntax, for instructing a processor to perform a certain function. Examples of a computer language may include C, C++, Java, BASIC, Perl, Matlab, Pascal, Visual BASIC, assembly language, machine code, microcode for a network processor, and so forth. The embodiments are not limited in this context.

System 100 may be implemented as a wired communication system, a wireless communication system, or a combination of both. Although system 100 may be illustrated using a particular communications media by way of example, it may be appreciated that the principles and techniques discussed herein may be implemented using any type of communication media and accompanying technology. The embodiments are not limited in this context.

When implemented as a wired system, system 100 may include one or more nodes arranged to communicate information over one or more wired communications media. Examples of wired communications media may include a wire, cable, printed circuit board (PCB), backplane, switch fabric, semiconductor material, twisted-pair wire, co-axial cable, fiber optics, and so forth. The communications media may be connected to a node using an input/output (I/O) adapter. The I/O adapter may be arranged to operate with any suitable technique for controlling information signals between nodes using a desired set of communications protocols, services or operating procedures. The I/O adapter may also include the appropriate physical connectors to connect the I/O adapter with a corresponding communications medium. Examples of an I/O adapter may include a network interface, a network interface card (NIC), a line card, a disc controller, video controller, audio controller, and so forth. The embodiments are not limited in this context.

When implemented as a wireless system, system 100 may include one or more wireless nodes arranged to communicate information over one or more types of wireless communication media. An example of a wireless communication media may include portions of a wireless spectrum, such as the radio-frequency (RF) spectrum. The wireless nodes may include components and interfaces suitable for communicating information signals over the designated wireless spectrum, such as one or more antennas, wireless transmitters/receivers ("transceivers"), amplifiers, filters, control logic, and so forth. As used herein, the term "transceiver" may be used in a very general sense to include a transmitter, a receiver, or a combination of both and may include various components such as antennas, amplifiers, and so forth. Examples for the antenna may include an internal antenna, an omni-directional antenna, a monopole antenna, a dipole antenna, an end fed antenna, a circularly polarized antenna, a micro-strip antenna, a diversity antenna, a dual antenna, an antenna array, and so forth. The embodiments are not limited in this context.

The nodes of the system 100 may comprise or form part of a network, such as a wireless personal area network (WPAN), a wireless local area network (WLAN), a wireless metropolitan area network (WMAN), a wireless wide area network (WWAN), a Code Division Multiple Access (CDMA) cellular radiotelephone communication network, a third generation (3G) network such as Wide-band CDMA (WCDMA), a fourth generation (4G) network, a Time Division Multiple Access (TDMA) network, an Extended-TDMA (E-TDMA) cellular radiotelephone network, a Global System for Mobile Communications (GSM) cellular radiotelephone network, a North American Digital Cellular (NADC) cellular radiotelephone network, a universal mobile telephone system (UMTS) network, a Local Area Network (LAN), a Metropolitan Area Network (MAN), a Wide Area Network (WAN), the Internet, the World Wide Web, a telephony network (e.g., analog, digital, wired, wireless, PSTN, ISDN, or xDSL), a radio network, a television network, a cable network, a satellite network, and/or any other wired or wireless communications network configured to carry data. The embodiments are not limited in this context.

The nodes of the system 100 may be arranged to communicate one or more types of information, such as media information and control information. Media information generally may refer to any data representing content meant for a user, such as image information, video information, graphical information, audio information, voice information, textual information, numerical information, alphanumeric symbols, character symbols, and so forth. Control information generally may refer to any data representing commands, instructions or control words meant for an automated system. For example, control information may be used to route media information through a system, or instruct a node to process the media information in a certain manner. The media and control information may be communicated from and to a number of different devices or networks. The embodiments are not limited in this context.

The nodes of system 100 may communicate information in accordance with one or more protocols. A protocol may comprise a set of predefined rules or instructions to control how the nodes communicate information between each other. The protocol may be defined by one or more protocol standards as promulgated by a standards organization, such as IEEE, Internet Engineering Task Force (IETF), International Telecommunications Union (ITU), and so forth. For example, the system 100 may communicate information according to one or more IEEE 802 standards including IEEE 802.11x (e.g., 802.11a, b, g/h, j, n) standards for WLANs and/or 802.16 standards for WMANs. The nodes of the system 100 also may communicate information in according to one or more of the Digital Video Broadcasting Terrestrial (DVB-T) broadcasting standard, and the High performance radio Local Area Network (HiperLAN) standard. The embodiments are not limited in this context.

In various embodiments, the system 100 may comprise an OFDM system arranged to provide compensation of non-linear distortions at the receiver side. The described embodiments may be implemented in a transceiver for OFDM digital communication systems, for example. The system 100 may be arranged to decrease average error vector magnitude (EVM), after receiver-side equalization, for given transmitter output power (output back-off), and thus improve the system packet error rate (PER) performance. The embodiments are not limited in this context.

In various implementations, the system 100 may be illustrated and described as comprising several separate functional elements, such as modules and/or blocks. Although certain modules and/or blocks may be described by way of example, it can be appreciated that a greater or lesser number of modules and/or blocks may be used and still fall within the scope of the embodiments. Further, although various embodiments may be described in terms of modules and/or blocks to facilitate description, such modules and/or blocks may be implemented by one or more hardware components (e.g., processors, DSPs, PLDs, ASICs, circuits, registers), software components (e.g., programs, subroutines, logic) and/or combination thereof.

As shown in FIG. 1, the system 100 may comprise a transmitter node 102 arranged to receive a serial input data flow 104, such as a bit stream, at a modulator module 106. The modulator module 106 may employ various modulation techniques such as, for example: Binary Phase Shift Keying (BPSK) modulation, which communicates one bit per symbol, Quadrature Phase Shift Keying (QPSK) modulation, which communicates two bits per symbol, 8PSK, which communicates three bits per symbol, and/or Quadrature Amplitude Modulation (QAM) such as N-state QAM (N-QAM) including 16-QAM, which communicates four bits per symbol, 32-QAM, which communicates five bits per symbol, 64-QAM, which communicates six bits per symbol, 128-QAM, which communicates seven bits per symbol, and 256-QAM, which communicates eight bits per symbol. The embodiments are not limited in this context.

In one embodiment, for example, the modulator module 106 may comprise a QAM modulator module. The modulator module 106 may be arranged to generate an OFDM symbol 108 comprising N frequency symbols, with N representing a positive integer (e.g., 16, 64). In various implementations, The OFDM symbol 108 may be generated, for example, by dividing the serial input data flow 104 into groups and converting into N complex frequency symbols according to modulation encoding tables. The embodiments are not limited in this context.

The transmitter node 102 may comprise an inverse fast Fourier transform (IFFT) module 110. In various embodiments, the IFFT module 110 may convert the OFDM symbol 108 to a time-domain signal 112. The transmitter node 102 may comprise an interpolating filter block 114 for interpolating the time-domain signal 112 from the IFFT module 110. The embodiments are not limited in this context.

In various embodiments, the transmitter node 102 may be arranged to receive an interpolated signal 116 at a non-linear predistorter block 118. The non-linear predistorter block 118 may be arranged to perform predistortion of signal 116. In various implementations, the non-linear predistorter block 118 may perform predistortion based on a clipping ratio control signal 120 to generate a predistorted baseband signal 122. In various implementations, the transmitter node 102 may comprise a power amplifier 124 arranged to convert the predistorted baseband signal 122 to RF band and to amplify the converted signal for transmission by antenna 126. The embodiments are not limited in this context.

In various implementations, the non-linear predistorter block 118 may be arranged to perform predistortion of signal 116 to correct power amplifier non-linearity for given range of input signal magnitudes. In one embodiment, for example, the non-linear predistorter block 118 may be arranged to compensate for non-linearity of the power amplifier 124. For this range, the transfer function of the non-linear predistorter block 118 may comprise the inverse to the transfer function of the power amplifier 124. The embodiments are not limited in this context.

Figure 2:
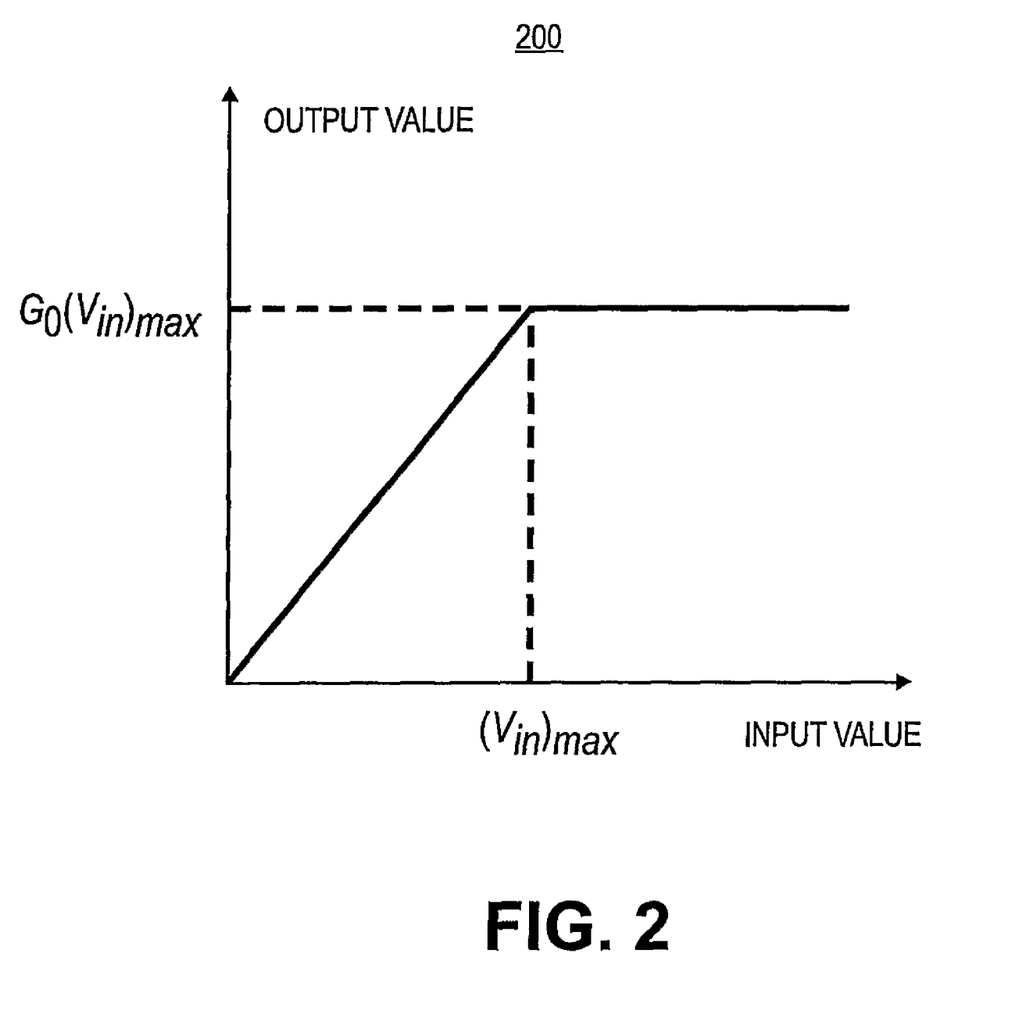
FIG. 2 illustrates one embodiment of a transfer function.

FIG. 2 illustrates one embodiment of a transfer function. FIG. 2 illustrates a transfer function 200, which may comprise an "ideal" angle-like form for the total transfer function of the non-linear predistortion block 118 with the power amplifier 124. In various embodiments, the transfer function 200 may be implemented according to the following equation:

$$V_{pr+pa} = \begin{cases} G_0 V, & \text{if } |V| \leq \hat{V}; \\ G_0 \hat{V} e^{i\varphi}, & \text{if } |V| > \hat{V}, \end{cases} \quad (1)$$

where $G_0$ is the PA gain, $V=|V|e^{i\varphi}$ is the input signal to the predistorter, $\hat{V}$ is signal magnitude at the input of the predistorter at which the linearized power amplifier (e.g., the non-linear predistorter block 118 and the power amplifier 124) achieves the maximum output value.

The value of $\hat{V}$ may be selected based on the design of the non-linear predistorter block 118, the digital-to-analog converter (DAC) range, and the transfer function form of the power amplifier 124. In various embodiments, the value of $\hat{V}$ comprises the maximum permissible amplitude over which the signal is clipped, so the predistortion scheme acts as envelope limiter with clipping ratio (cr) according to the following equation:

$$cr = \frac{\hat{V}}{\sqrt{E(|V|^2)}}, \quad (2)$$

where $E(|V|^2)$ is the average power of the signal at the input of the non-linear predistorter block 118.

In various embodiments, the clipping ratio comprises a controlled parameter. The non-linear predistorter block 118 may be arranged to provide the required clipping ratio according to the clipping ratio control signal 120. In various implementations, the value of cr may be selected to achieve a predetermined PAPR value of the signal. The desired PAPR value may depend on modulation type and code rate, for example. The amplified signal may be transmitted by the antenna 126. The embodiments are not limited in this context.

Referring again to FIG. 1, the transmitter node 102 may transmit information over communication channel 128. In various embodiments, the communication channel 128 may comprise one or more types of wireless communication media capable of carrying information. An example of a wireless communication media may include portions of a wireless spectrum, such as the RF spectrum. The embodiments are not limited in this context.

In various implementations, the system 100 may form part of a multicarrier system such as a multiple-input multiple output (MIMO) system, which may convey more that one data stream to more than one antenna. In such embodiments, the communication channel 128 may comprise one or more multicarrier communication channels for communicate multicarrier communication signals. A multicarrier channel may comprise, for example, a wideband channel comprising multiple subchannels. Each subchannel may comprise closely spaced orthogonal data subcarriers allowing a single OFDM symbol to be transmitted together by the data subcarriers. The embodiments are not limited in this context.

The system 100 may comprise a packet network for communicating information in accordance with one or more packet protocols as defined by one or more IEEE 802 standards, for example. In various embodiments, the system 100 may employ the Asynchronous Transfer Mode (ATM) protocol, the Physical Layer Convergence Protocol (PLCP), Frame Relay, Systems Network Architecture (SNA), and so forth. In another example, the system 100 may communicate packets using a medium access control protocol such as Carrier-Sense Multiple Access with Collision Detection (CSMA/CD), as defined by one or more IEEE 802 Ethernet standards. In yet another example, the system 100 may communicate packets in accordance with Internet protocols, such as the Transport Control Protocol (TCP) and Internet Protocol (IP), TCP/IP, X.25, Hypertext Transfer Protocol (HTTP), User Datagram Protocol (UDP), and so forth. The embodiments are not limited in this context.

In various embodiments, the system 100 may be arranged to segment a set of media information and control information into a series of packets. A packet generally may comprise a discrete data set having fixed or varying lengths, and may be represented in terms of bits or bytes. A typical packet length, for example, might comprise 1000 bytes. Each packet may contain a portion of the media information plus some control information and have a sequence number. The control information may assist routing each packet to an intended destination. A destination node may receive the entire set of packets, place them in the correct order using the sequence numbers, and reproduce the media information. It can be appreciated that the described embodiments are applicable to any type of communication content or format, such as packets, cells, frames, fragments, units, and so forth. The embodiments are not limited in this context.

The system 100 may comprise a receiver node 130 for receiving information over channel 128. In various embodiments, a signal received by an antenna 132 may be converted by a down conversion block 134 from RF to a baseband time-domain signal 136. The receiver node 130 may comprise a FFT module 138 for converting the time-domain signal 136 to a frequency-domain signal 140. The embodiments are not limited in this context.

In various embodiments, the receiver node 130 may comprise a clipping ratio estimation block 142. The clipping ratio estimation block 142 may be arranged to receive the time-domain signal 136 and to generate a clipping ratio estimate 144. In various implementations, the clipping ratio estimate 144 approximates the clipping ratio used in the non-linear predistorter block 118 at the transmitter node 110. The embodiments are not limited in this context.

The receiver node 130 may comprise a channel equalization block 146. In various embodiments, channel equalization block 146 may be arranged to correct the signal 140 for frequency selective channel linear distortions. Correction may involve, for example, multiplying the frequency-domain OFDM symbol by the function inverse to a channel frequency transfer function. In various implementations, the channel equalization block 146 may be arranged to estimate the channel frequency transfer function using predistorted training OFDM symbols 148 provided by a training signal predistortion module 150. The predistorted training OFDM signals 148 may be provided by the training signal predistortion module 150 using the clipping ratio estimate 144 provided by the clipping ratio estimation block 142. The embodiments are not limited in this context.

The receiver node 130 may comprise a constellation correction block 154. In various embodiments, the constellation correction block 154 may be arranged to receive frequency symbols 152 from the channel equalization block 146 and to correct the frequency symbols 152 to compensate for scaling distortion caused by clipping at the transmitter node 102. Correction may involve, for example, multiplying the frequency symbols 152 by constellation correction coefficients 156 provided by a constellation correction coefficients block 158. In various implementations, the constellation correction coefficients block 158 may provide the constellation correction coefficients 156 using the clipping ratio estimate 144 provided by the clipping ratio estimation block 142. The embodiments are not limited in this context.

The receiver node 130 may receive a corrected OFDM symbol 160 from the constellation correction block 154 at a demodulator module 162. The demodulator module 162 may employ various demodulation techniques (e.g., BPSK, QPSK, QAM, N-QAM). In one embodiment, for example, the demodulator module 106 may comprise a QAM demodulator module. In various implementations, the demodulator module 162 may receive the corrected OFDM symbol 160 where the complex symbols are converted to a serial data output flow 164. The embodiments are not limited in this context.

Figure 3:
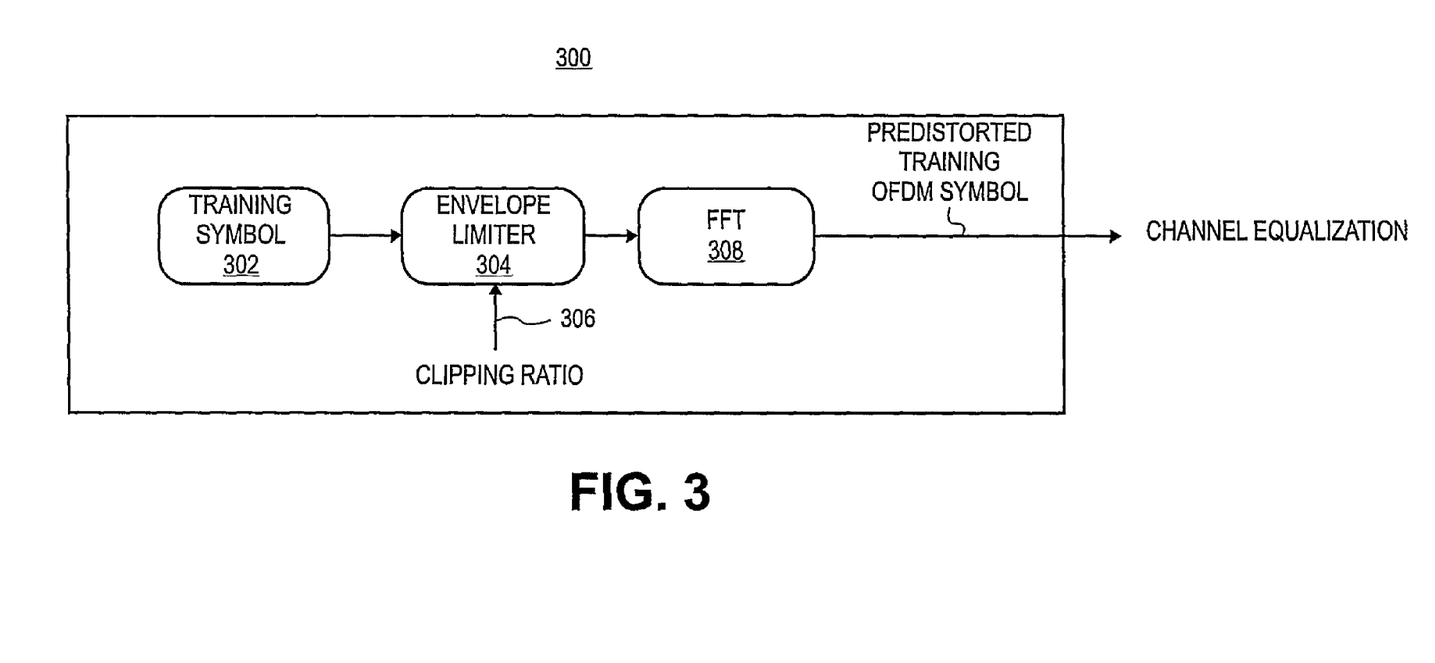
FIG. 3 illustrates one embodiment of a module.

FIG. 3 illustrates one embodiment of a module. FIG. 3 illustrates a training signal predistortion module 300, which may comprise one implementation of the training signal predistortion module 150 illustrated in FIG. 1. It is to be understood that other embodiments of the training signal predistortion module 150 may be implemented by various other types of hardware, software, and/or combination thereof.

In various embodiments, the training signal predistortion module 300 may store a training symbol 302 at an envelope limiter block 304. The training symbol 302 may comprise an oversampled time-domain training signal, for example. In various implementations, the envelope limiter block 304 may be arranged to clip the training symbol 302 according to a selected clipping ratio 306. In one embodiment, for example, the clipping ratio 306 may be provided by the clipping ratio estimation block 142 illustrated in FIG. 1. In another embodiment, the clipping ratio 306 may be sent from the transmitter node 102 in a PLCP header of the packet. In various implementations, the clipping ratio 306 may be estimated by measuring the PAPR of a received signal. The embodiments are not limited in this context.

The training signal predistortion module 300 may comprise a FFT module 308. In various embodiments, the FFT module 308 may be arranged to convert the predistorted time-domain signal to the frequency-domain. At the output of the training signal predistortion module 300, the predistorted training OFDM symbols may be used for channel equalization and may be provided to the channel equalization block 146 of FIG. 1, for example. In other embodiments, frequency-domain training signals predistorted in time domain with various clipping ratios may be stored in a look-up table. The embodiments are not limited in this context.

Operations for the above systems, nodes, apparatus, elements, and/or sub-systems may be further described with reference to the following figures and accompanying examples. Some of the figures may include programming logic. Although such figures presented herein may include a particular programming logic, it can be appreciated that the programming logic merely provides an example of how the general functionality as described herein can be implemented. Further, the given programming logic does not necessarily have to be executed in the order presented unless otherwise indicated. In addition, the given programming logic may be implemented by a hardware element, a software element executed by a processor, or any combination thereof. The embodiments are not limited in this context.

Figure 4:
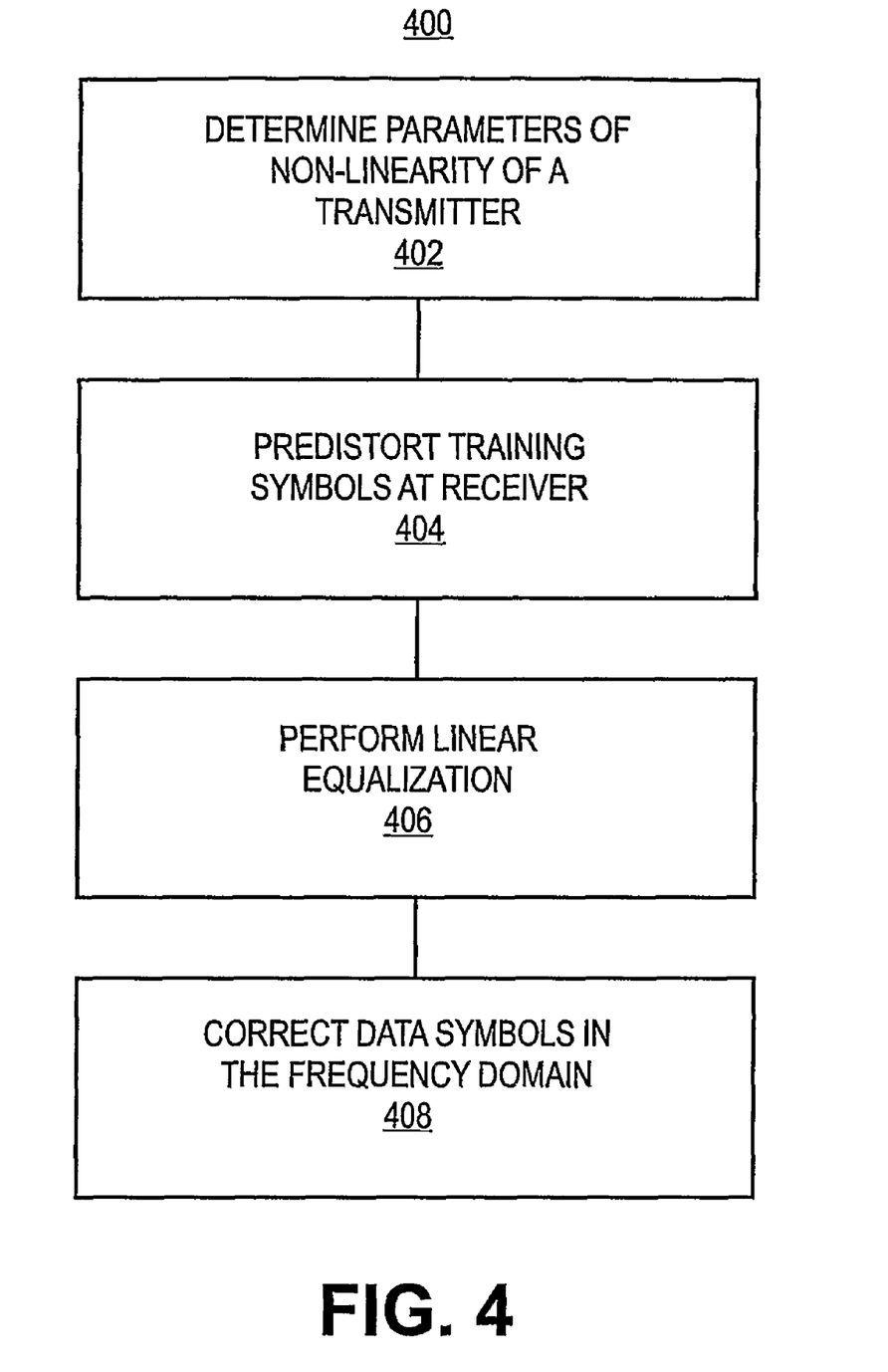
FIG. 4 illustrates one embodiment of programming logic.

FIG. 4 illustrates one embodiment of programming logic. FIG. 4 illustrates programming logic 400 for performing compensation of non-linear transmitter distortion. In various implementations, the programming logic 400 may be performed by one or more elements of system 100 and/or module 300, for example. It is to be understood that the programming logic 400 may be implemented by various other types of hardware, software, and/or combination thereof.

In various embodiments, the programming logic 400 may comprise a technique for compensation of distortions, caused by non-linearity of the transmitter, at the receiver side. The OFDM signal with BPSK, QPSK, QAM such as N-QAM.

The programming logic 400 may comprise determining parameters of non-linearity of a transmitter (block 402). In various implementations, the parameters of non-linearity of a transmitter are determined at a receiver. The parameters of non-linearity may comprise the clipping ratio of an envelope limiter of the transmitter. In one embodiment, the parameters may be included as side information in a PLCP header of a packet transmitted to a receiver. In another embodiment, the parameters may be estimated at the receiver by processing the received signal. The embodiments are not limited in this context.

The programming logic 400 may comprise predistorting training symbols at the receiver (block 404). In various implementations, training OFDM symbols may be purposely or deterministically predistorted. In various embodiments, predistortion may be carried out in time domain at the receiver side corresponding to the way distortion was performed at the transmitter. For example, if envelope limiting was applied to the training signal at the transmitter, the training signal at the receiver may be clipped with the same clipping ratio. Accordingly, when transmitter non-linearity is parameterized, it may be reproduced with the same parameters. In some embodiments, the coefficients of polynomial expansion of the power amplifier transfer function may serve as non-linearity parameters. The predistorted training symbols may be used for channel estimation and equalizer correction. The embodiments are not limited in this context.

The programming logic 400 may comprise performing linear equalization at the receiver procedure (block 406). In various implementations, the predistorted training symbols may be used for channel equalization. In various embodiments, channel equalization may involve estimating a channel frequency transfer function using predistorted training OFDM symbols and multiplying the frequency-domain OFDM symbol by the function inverse to a channel frequency transfer function. The embodiments are not limited in this context.

The programming logic 400 may comprise correcting data symbols in the frequency domain (block 408). In various implementations, correction may be performed to eliminate rotation and attenuation distortion caused by non-linear transformation at the transmitter. In various embodiments, correction may involve multiplying frequency symbols by constellation correction coefficients. The embodiments are not limited in this context.

Figure 5:
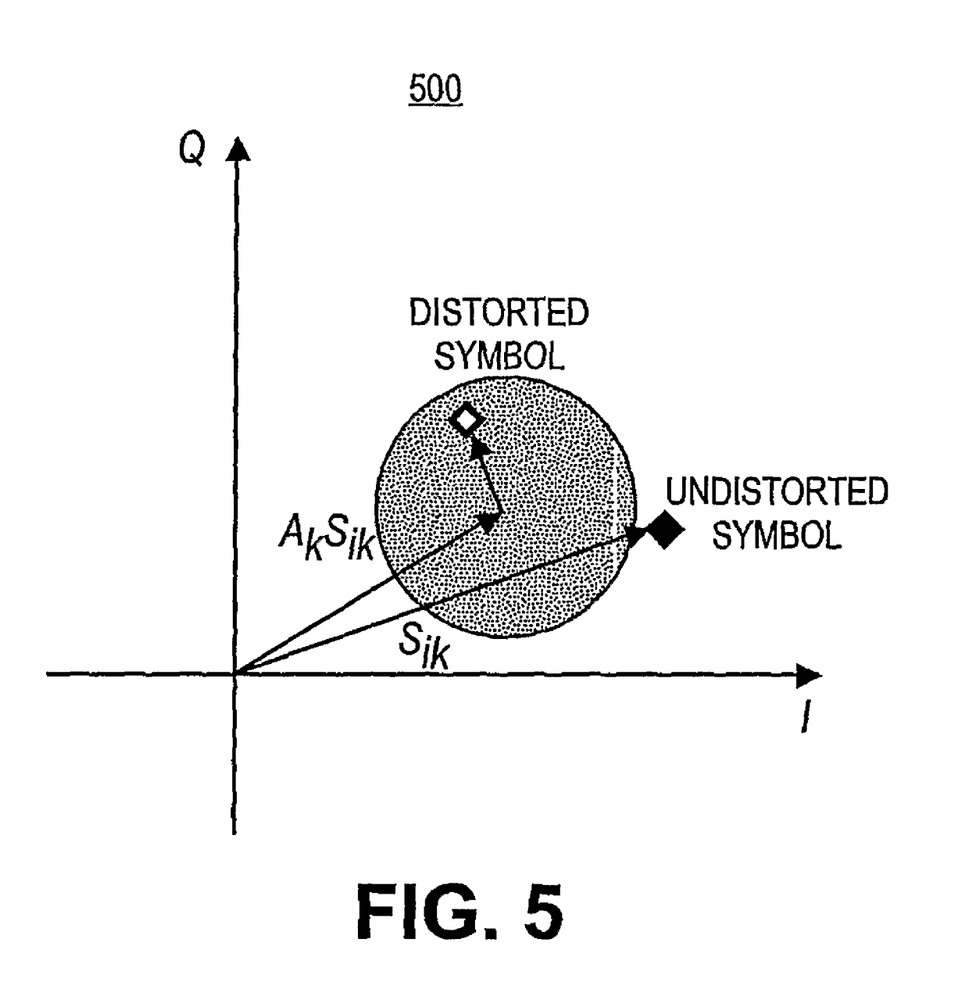
FIG. 5 illustrates one embodiment of a symbol representation.

FIG. 5 illustrates one embodiment of a symbol representation. FIG. 5 illustrates a representation 500 of a distorted subcarrier symbol. In various embodiments, the distortion of subcarrier symbol, caused by non-linearity of the transmitter, may be described by complex scaling (rotation and attenuation) and non-linear noise term. In various implementations, the vector of ith constellation symbol mapped to kth subcarrier at the transmitter output ($s_{ik}^{TX}$) may be written as scaled original undistorted position ($s_{ik}$) plus noise ($n_{ik}$) according to the following equation:

$$s_{ik}^{TX} = a_{ik} s_{ik} + n_{ik}, \quad k=1, 2, \ldots, N. \tag{3}$$

The values of complex scaling coefficient $a_{ik}$ and the variance of non-linear noise $n_{ik}$ depend on power amplifier non-linearity and input back-off. In various implementations, the values may be considered to be substantially independent of constellation point i and subcarrier number k, so it can be supposed that $a_{ik}=a$.

At the receiver, the position of the ith constellation symbol at the kth subcarrier may be written according to the following equation:

$$s_{ik}^{RX}=H_k s_i^{TX}+c_k=H_k(as_{ik}+n_k)+c_k=H_k as_{ik}+H_k n_k+c_k, \quad (4)$$

where $H_k$ is the frequency transfer function of the channel at frequency of the kth subcarrier to which the ith constellation symbol was mapped, $c_k$ is the additive noise at the kth subcarrier due to channel interference and receiver background noise.

To compensate for frequency selective channel distortions at the receiver side, the equalizer is used with frequency transfer function which is the inverse of the channel transfer function estimate according to the following equation:

$$H_k^{EQ}=\widehat{H}_k^{-1}. \quad (5)$$

The channel frequency transfer function may be estimated with help of training sequence. However, when the transmitter operates with small power amplifier input back-off, the training signal is also distorted by non-linear transformation. Consequently, performing channel estimation using an undistorted training signal at the receiver is not accurate. The regime with small input back-off for transmitting the training signals becomes critical when the training signals are boosted as in modern communication standards.

In various implementations, a deterministically predistorted training signal at the receiver provides the frequency transfer function estimate with smaller error in comparison with an undistorted training signal. In some cases, the transmitted training signal ("sounding" the channel) and reference training signal used at the receiver may be identical. In these cases, it is equivalent to eliminating the effect of both scaling coefficient a and additive non-linear "noise" $n_k$ in equation (4) when processing the training signal at the receiver.

After channel estimation and equalization of the received data symbols, it is possible at the receiver to reduce the EVM of the data symbols by eliminating effect of scaling coefficient a. The subcarrier symbols after equalization may be multiplied by complex coefficient which is selected to minimize the average constellation error.

Figure 6:
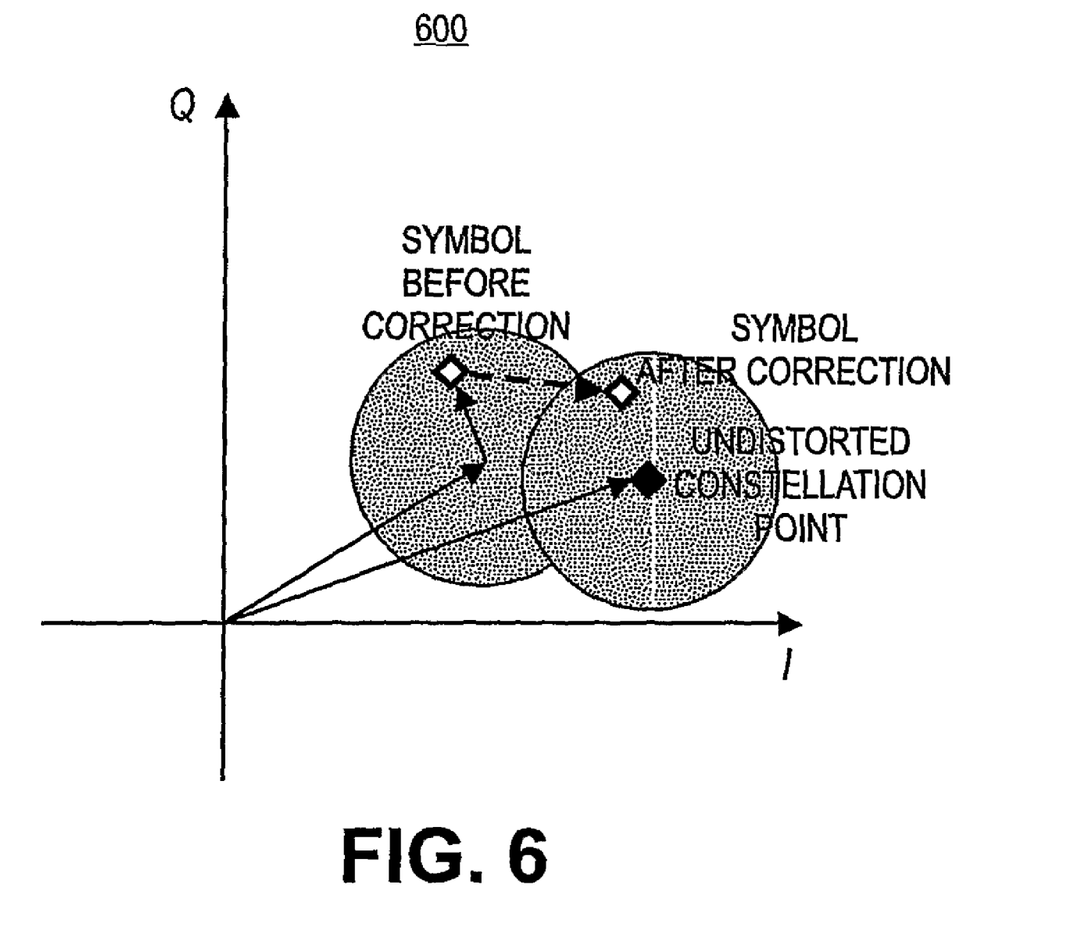
FIG. 6 illustrates one embodiment of a symbol representation.

FIG. 6 illustrates one embodiment of a symbol representation. FIG. 6 illustrates a representation 600 of constellation symbol correction. As shown, the constellation "cloud" is shifted in direction to a position where it would be in the case of a perfectly linear transceiver.

In various implementations, the described embodiments may correct data symbol constellation distortion by exploiting information on parameters of transmitter non-linearity. This information may be obtained at the receiver whether through estimation through processing the received signal or may be sent to the receiver as side information.

In various implementations, the described embodiments may partially compensate the impact of distortions caused by non-linearity of the transmitter at the receiver side. The described embodiments may improve channel estimation and performance of equalization scheme when a training signal is non-linearly distorted at the transmitter. This advantage is important because the training signals are boosted in modern communication standards.

In various implementations, the described embodiments may make additional correction for rotation and attenuation distortions of data symbol constellations caused by the non-linear transmitter. The described embodiments may reduce bit-error ratio (BER) for given transmitted power with little additional complexity required.

Figure 7:
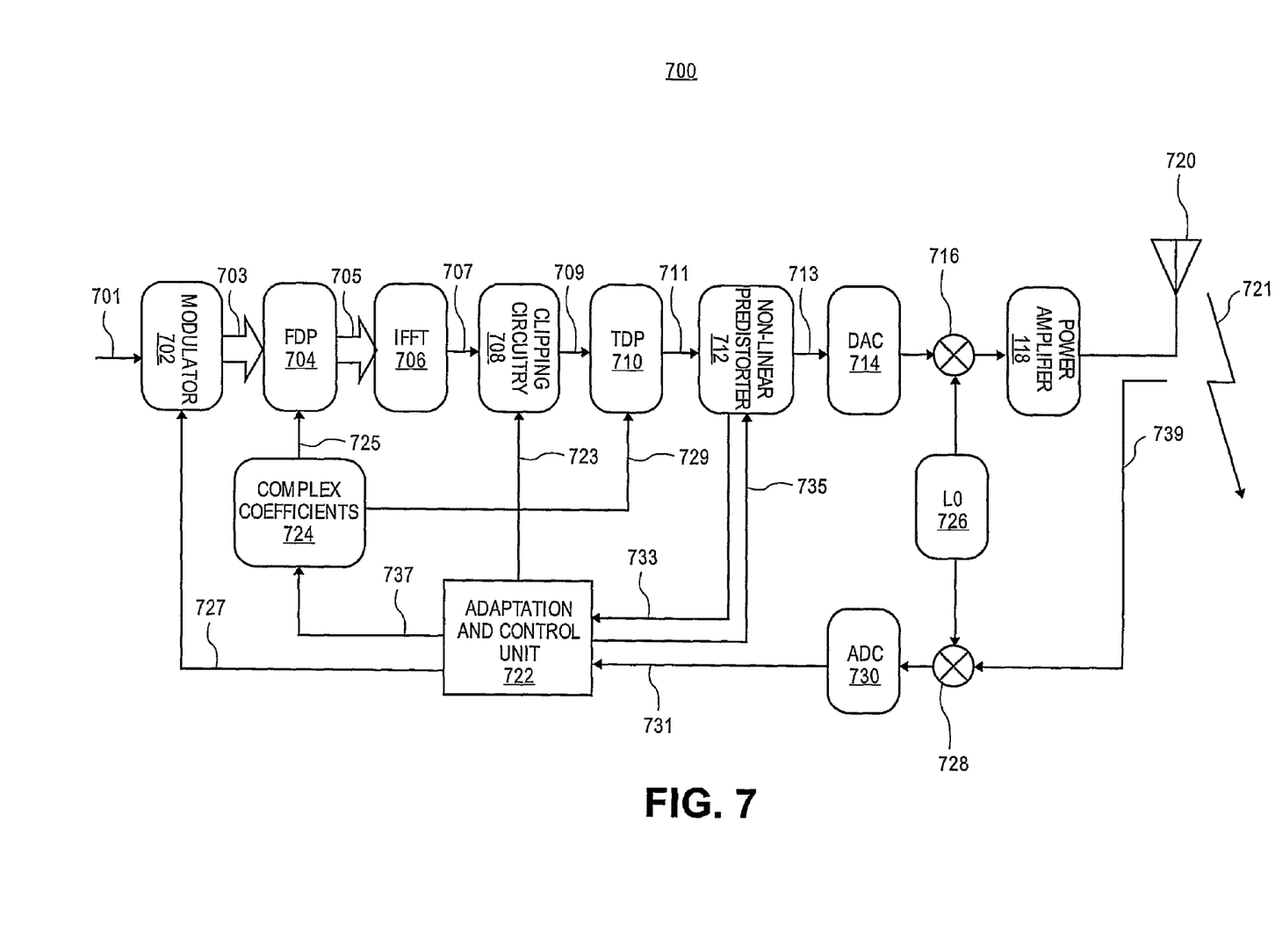
FIG. 7 illustrates one embodiment of a node.

FIG. 7 illustrates one embodiment of a node. FIG. 7 illustrates a block diagram of a transmitter node 700. The transmitter node 700 may comprise a power amplifier predistortion linearizer with out-of-band radiation control. In various embodiments, the transmitter node 700 may comprise a multicarrier transmitter for implementing predistortion and linearization techniques to allow a power amplifier to operate more efficiently while generating less in-band and out-of-band distortion. In various implementations, the transmitter node 700 may be employed by system 100. It is to be understood that the transmitter node 700 may be implemented by various other types of hardware, software, and/or combination thereof.

Transmitter node 700 may comprise modulator 702 to modulate groups of bits of bit stream 701 to generate a plurality of subcarrier symbols 703. Transmitter node 700 also may comprise adaptation and control unit 722. In some embodiments, modulator 702 may generate subcarrier symbols 703 based on modulation type and coding rate input 727 provided by adaptation and control unit 722. Modulator 702 may generate one of subcarrier symbols 703 for each subcarrier of a plurality of subcarriers of a multicarrier channel. The embodiments are not limited in this context.

Transmitter node 700 may comprise frequency-domain predistorter 704 to multiply complex amplitudes of a multicarrier symbol by complex coefficients 725. Transmitter node 700 may comprise IFFT circuitry 706 to generate time-domain baseband signal 707 from frequency-domain output 705 of frequency-domain predistorter 704, and clipping circuitry 708 to reduce signal peaks of time-domain baseband signal 707. The embodiments are not limited in this context.

Transmitter node 700 may comprise time-domain predistorter 710 to perform low-pass filtering on time-domain baseband signal 709 based on complex coefficients 729. Frequency-domain predistorter 704 may be a frequency-domain filter, and time-domain predistorter 710 may be a time-domain filter. Complex coefficients 725 and complex coefficients 729 may be provided by adaptation and control unit 722. The embodiments are not limited in this context.

Transmitter node 700 may comprise non-linear predistorter 712 to generate predistorted signal 713, DAC 714 to convert predistorted signal 713 to analog, mixer 716 to upconvert the signal based on a local-oscillator signal provided by local oscillator (LO) 726, and power amplifier 718 to amplify the upconverted signal for transmission by antenna 720. Transmitter node 700 may comprise mixer 728 to downconvert sampled output signal 739 and analog-to-digital converter (ADC) 730 to digitize the sampled and downconverted output signal to generate downconverted and digitized sampled output 731. The embodiments are not limited in this context.

Adaptation and control unit 722 may provide predistortion control signal 735 to non-linear predistorter 712 to adjust a predistorted signal maximum of signal 713. In various embodiments, adaptation and control unit 722 may adjust the predistorted signal maximum of signal 713 based on a saturation level of power amplifier 718, which may be determined, at least in part, by sampled output 731. The embodiments are not limited in this context.

The multicarrier symbol generated by modulator 702 may comprise a plurality of subcarrier symbols 703. Each subcarrier symbol 703 may be associated with one of a plurality of subcarriers of a multicarrier communication signal that may be subsequently transmitted by antenna 720. In various embodiments, one of complex coefficients 725 may be provided for each subcarrier of the multicarrier channel. The embodiments are not limited in this context.

In various embodiments, transmitter node 700 may comprise an OFDM transmitter. In such embodiments, the multicarrier symbol may be an OFDM symbol comprising a plurality of subcarrier symbols 703 corresponding to symbol-modulated subcarriers that may be subsequently transmitted by antenna 720. In such embodiments, transmitter node 700 may comprise RF circuitry to generate multicarrier or OFDM signal 721 comprising a plurality of substantially orthogonal symbol-modulated subcarriers. The embodiments are not limited in this context.

In various embodiments, frequency-domain predistorter 704 may perform a substantially linear transformation by multiplying (in the frequency domain) a complex amplitude of each of subcarrier symbols 703 by an associated one of complex coefficients 725. In such embodiments, time-domain predistorter 710 may perform a substantially linear transformation (in the time domain) on time-domain baseband signal 709 providing a frequency transfer function inverse to that of frequency-domain predistorter 704. The embodiments are not limited in this context.

In various embodiments, complex coefficients 725 may be selected to provide a frequency transfer function of frequency-domain predistorter 704 approximately inverse to a frequency transfer function of time-domain predistorter 710 for in-band signal components. Complex coefficients 725 may be selected to substantially, or at least in part, correct for linear distortion subsequently introduced by time-domain predistorter 710. Linear distortion may change the relationship of the magnitude and phases of the subcarriers that comprise the signal. The combination of frequency-domain predistortion introduced by frequency-domain predistorter 704, non-linear distortion introduced by clipping circuitry 708 and time-domain predistortion introduced by time-domain predistorter 710 may help transmitter node 700 achieve a spectral flatness within a range to help meet WLAN standards. The embodiments are not limited in this context.

In various embodiments, frequency-domain predistorter 704 may at least in part, compensate for in-band linear distortion introduced by time-domain predistorter 710. In such embodiments, the low-pass filtering performed by the time-domain predistorter 710 may help suppress out-of-band components in time-domain baseband signal 709 that may have resulted from the operation of clipping circuitry 708. The embodiments are not limited in this context.

In various embodiments, adaptation and control unit 722 may provide different sets of coefficients 725 to frequency-domain predistorter 704 and different corresponding sets of coefficients 729 to time-domain predistorter 710 for different modulation types associated with the subcarrier symbols 703. In such embodiments, sets of coefficients 725 and 729 may be selected for specific modulation types. In various embodiments, coefficients 725, 729 may be selected to suppress of out-of-band components to help meet transmit spectrum mask requirements that may be imposed by some wireless communication standards. The embodiments are not limited in this context.

In various embodiments, clipping circuitry 708 may clip input baseband signal 708 based on clipping level input 723. In such embodiments, signals modulated with low-order modulation types (e.g., BPSK, QPSK) and/or low coding rates may be clipped with a smaller ratio of the clipping level to the average signal power in comparison with signals with higher-order modulation types and/or higher coding rates. The smaller that the ratio of the clipping level is to the average signal power of signal 707, the larger the power of out-of-band distortions will be in signal 709 that results from clipping. The suppression of out-of-band components of different levels may be used to select of different set of coefficients 729 for time-domain predistorter 710. In various embodiments, adaptation and control unit 722 may manage the trade-off between in-band linear distortion caused by time-domain predistorter 710 and the degree of out-of-band suppression provided by time-domain predistorter 710. In various implementations, to enhance performance, different sets of coefficients 725, 729 may be used for different clipping levels. The embodiments are not limited in this context.

In various embodiments, clipping circuitry 708 may reduce signal peaks by clipping time-domain baseband signal 707 based on clipping level input 723. A "clipped" time-domain baseband signal (e.g., signal 709) may have a reduced PAPR in comparison with signal 707. Lower clipping levels may result in larger degree of PAPR reduction. The clipping level may be selected based on the modulation type and/or the coding rate used. A larger PAPR reduction may result in larger signal distortion for both in-band and out-of-band signal components. Lower PAPR, however, may enable a higher transmitted power. For higher order modulation types and/or the higher coding rates, larger distortions may be more easily corrected at the receiver, so signals with lower order modulation types (e.g., BPSK, QPSK) and lower coding rates may be clipped at a lower clipping level in comparison with signals modulated at higher order modulation types (e.g., 16-QAM and 64-QAM). The clipping performed by circuitry 708 and time-domain filtering performed by time-domain predistorter 710 may reduce the PAPR of baseband signal 707 by implementing this PAPR reduction scheme. The embodiments are not limited in this context.

Transmitter node 700 may further comprise coefficient storage element 724 to store complex coefficients 725 for use by frequency-domain predistorter 704 and complex coefficients 729 for use by time-domain predistorter 710. The complex coefficients 725 may be different for at least some of the subcarriers. Different complex coefficients may be provided by coefficient storage element 724 for each subcarrier or for sets of subcarriers. The embodiments are not limited in this context.

In various embodiments, different sets of complex coefficients 725 for use by frequency-domain predistorter 704 and different sets of complex coefficients 729 for use by time-domain predistorter 710 may be stored in storage element 724 for each modulation type that may be used by modulator 702 and/or different clipping levels used by clipping circuitry 708. Control signal 737 may be provided by adaptation and control unit 722 to select appropriate set of coefficients. Coefficient storage element 724 may comprise almost any type of a non-volatile storage element including, for example, semiconductor memory. The embodiments are not limited in this context.

After the operation of clipping circuitry 708 and the operation of time-domain predistorter 710, non-linear predistorter 712 may operate on signal 711 to generate signal 713. In various implementations, adaptation and control unit 722 may provide predistortion control signal 735 to non-linear predistorter 712 to adjust a predistorted signal maximum of signal 713 based on a saturation level of power amplifier 718. The predistorted signal maximum selected for signal 713 (e.g., the maximum signal level of signal 713) may determine the maximum input signal level to power amplifier 718. When the predistorted signal maximum is adjusted, the maximum input signal level of the power amplifier is also set. The embodiments are not limited in this context.

In various embodiments, the maximum input signal level of the power amplifier may be set a maximum power amplifier output which may be a predetermined proportion of the power amplifier's saturation level. In various implementations, the maximum output level of power amplifier 718 may be set high (e.g., 95-99% of the saturation level of the power amplifier) when power amplifier 718 has a small saturation level relative to a desired or needed transmit power level. In various embodiments, maximum output level of power amplifier 718 may be set lower (e.g., 50-70% of the saturation level) when power amplifier 718 has a larger saturation level relative to a desired or needed transmit power level. In various embodiments, as the saturation level of power amplifier 718 increases, the predistorted signal maximum may also be increased so that the proportion between the saturation level and the maximum output of power amplifier 718 may remain about the same. In various implementations, the predistorted signal maximum of signal 713 may be adjusted or updated by adaptation and control unit 722 after the transfer function of power amplifier 718 is measured by adaptation and control unit 722 using sampled output 731. The embodiments are not limited in this context.

In various embodiments, the saturation level and the transfer function of power amplifier 718 may be measured during a calibration process. In an "on-line" (transmission) calibration mode, adaptation and control unit 722 may determine the transfer function based on comparing signal 733, which may correspond to signal 713, to sampled output signal 731. In an "off-line" (no air transmission) calibration mode, adaptation and control unit 722 may determine the transfer function based on predetermined calibration signals. In other embodiments, the saturation level and the transfer function of power amplifier 718 may be determined from a look-up table. In these embodiments, the look up table may be generated from parameters such as power amplifier temperature and supply voltage using measurements made at manufacturing. The embodiments are not limited in this context.

In various implementations, non-linear predistorter 712 may pre-distort digital signal output 711 provided by time-domain predistorter 710 to, at least in part, compensate for non-linear distortion introduced subsequently by power amplifier 718. Non-linear predistorter 712 may perform a non-linear transformation on an input complex signal (e.g., digital signal 711) using predistortion coefficients stored in a look-up table of a memory structure (not separately illustrated). In various embodiments, these predistortion coefficients may be complex and may provide compensation for both AM-AM and AM-PM non-linear distortion. As used herein, AM refers amplitude modulation, and PM refers to phase modulation. In some other embodiments, the predistortion coefficients may be real and may provide compensation for AM-AM distortion. In other embodiments, non-linear predistorter 712 may perform a non-linear transform using a polynomial expansion of a predistortion function, which may be an inverse function of the power amplifier transfer function. The embodiments are not limited in this context.

In various embodiments, time-domain predistorter 710 may be a Gaussian filter which may have a step response function (e.g., a response to a unit step input) that may be a monotonically increasing function. In other embodiments, filters with some small ripple in their step response function may also be used as time-domain predistorter 710. The maximum magnitude of the ripple may be taken into account for calculating the predistorted signal maximum of signal 713 at the output of non-linear predistorter 712. The embodiments are not limited in this context.

In various implementations, adaptation and control unit 722 may adjust the predistorted signal maximum by providing predistortion control signal 735 so that a predistorted signal output of the non-linear predistorter 712 (e.g., signal 713) drives the maximum output level of power amplifier 718 to a predetermined percent of its saturation level. In various implementations, the predistorted signal maximum may be adjusted so that predistorted signal output level of non-linear predistorter 712 does not completely saturate power amplifier 718 and that the output level of power amplifier 718 is within the predetermined percent of the saturation level. The predetermined percent may range from 50% to 99%. The embodiments are not limited in this context.

The transfer function of power amplifier 718 may change due to temperature or voltage supply variations and/or over time. In various embodiments, revised predistortion coefficients of non-linear predistorter 712 may be used. Furthermore, a revised predistorted signal maximum may be determined by adaptation and control unit 722 as the power amplifiers transfer function changes to help maintain the operation of power amplifier 718 within the predetermined percentage of saturation. In some embodiments, the revised predistortion coefficients may be stored in a look-up table. In other embodiments, the revised coefficients of a polynomial expansion of the predistortion function may be stored in the look-up table. The embodiments are not limited in this context.

In various embodiments, adaptation and control unit 722 may generate predistortion control signal 735 by comparing downconverted and digitized sampled output 731 from power amplifier 718 with predistorted signal output 713 (e.g., which may be provided as signal 733) to determine an amount of distortion introduced by power amplifier 718 to compensate, at least in part, for the non-linear distortion introduced by power amplifier 718. In some embodiments, adaptation and control unit 722 may generate predistortion control signal 735 by comparing downconverted and digitized sampled output 731 from power amplifier 718 with signal 711 (e.g., provided as signal 733) to determine an amount of residual distortion from both non-linear predistorter 712 and power amplifier 718 which was non-compensated for by non-linear predistorter 712. The embodiments are not limited in this context.

In various embodiments, IFFT circuitry 106 may perform an interpolation by adding zeros to both sides of frequency-domain output 105, which may be frequency-domain samples, when an IFFT size is greater than a number of subcarriers. Alternatively, one or more interpolation filters may be used after IFFT circuitry 106. The embodiments are not limited in this context.

In various embodiments, modulator 102 may be a QAM modulator. In some OFDM embodiments, the multicarrier channel may comprise a 20 MHz channel having up to forty-eight or more data subcarriers and up to four or more non-data subcarriers. The subcarriers, when transmitted by antenna 720, may be closely spaced orthogonal subcarriers allowing a single OFDM symbol to be transmitted together by the data subcarriers. To achieve orthogonality between closely spaced subcarriers, the subcarriers may have a null at substantially a center frequency of the other subcarriers of the OFDM channel. Interleaving and/or encoding operations may be performed on bit stream 101 prior to operation by modulator 102.

In various implementations, adaptation and control unit 722 may select a set of coefficients 725 for frequency-domain predistorter 104 and may select a set of coefficients 729 for time-domain predistorter 710 based on the selected modulation type. Modulation types used by modulator 102 may include BPSK, QPSK, and/or QAM such as N-QAM. Modulation types with higher data communication rates per subcarrier may also be used. For example, when modulator 102 uses BPSK modulation, a set of complex coefficients 725 may be provided to frequency-domain predistorter 104 and a corresponding set of coefficients 729 may be provided to time-domain predistorter 710. When modulator 102 is instructed to use a different modulation type, such as 64-QAM, a different set of complex coefficients 725 may be provided to frequency-domain predistorter 104 and a corresponding different set of coefficients 729 may be provided to time-domain predistorter 710. The embodiments are not limited in this context.

In various embodiments, frequency-domain predistorter 704 may perform a substantially linear transformation on frequency-domain samples 703 that comprise a multicarrier symbol. Clipping circuitry 708 may perform a non-linear transformation on time-domain baseband signal 707 generated from linearly transformed frequency domain samples 705 provided by the frequency-domain predistorter 704. Time-domain predistorter 710 may perform a substantially linear transformation on clipped time-domain baseband signal 109 provided by the clipping circuitry. Non-linear predistorter 712 may perform a non-linear transformation on linearly transformed clipped time-domain signals 711 provided by the time-domain predistorter 710. Power amplifier 718 may perform a non-linear transformation by amplifying an upconverted analog version of output signals provided by the non-linear predistorter 712. In some embodiments, frequency-domain predistorter 104 and time-domain predistorter 710 may have approximately inverse frequency transfer functions (e.g., frequency response). Non-linear predistorter 712 may compensate at least in part for non-linear distortion introduced by the power amplifier 718, and a predistorted signal maximum of non-linear predistorter 712 may be adjusted to achieve a predetermined saturation level of power amplifier 718. The substantially linear transforms performed by frequency-domain predistorter 704 and time-domain predistorter 710 may be linear transforms in which output signals may be generated from current input signals and at least some prior input signals (e.g., linear transformations with memory). The embodiments are not limited in this context.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

In various embodiments, communications media may be connected to a node using an input/output (I/O) adapter. The I/O adapter may be arranged to operate with any suitable technique for controlling information signals between nodes using a desired set of communications protocols, services or operating procedures. The I/O adapter may also include the appropriate physical connectors to connect the I/O adapter with a corresponding communications medium. Examples of an I/O adapter may include a network interface, a network interface card (NIC), disc controller, video controller, audio controller, and so forth. The embodiments are not limited in this context.

Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, and the like. The instructions may be implemented using any suitable high-level, low-level, object-oriented, visual, compiled and/or interpreted programming language, such as C, C++, Java, BASIC, Perl, Matlab, Pascal, Visual BASIC, assembly language, machine code, and so forth. The embodiments are not limited in this context.

Some embodiments may be implemented using an architecture that may vary in accordance with any number of factors, such as desired computational rate, power levels, heat tolerances, processing cycle budget, input data rates, output data rates, memory resources, data bus speeds and other performance constraints. For example, an embodiment may be implemented using software executed by a general-purpose or special-purpose processor. In another example, an embodiment may be implemented as dedicated hardware, such as a circuit, an ASIC, PLD, DSP, and so forth. In yet another example, an embodiment may be implemented by any combination of programmed general-purpose computer components and custom hardware components. The embodiments are not limited in this context.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

The invention claimed is:

1. An apparatus, comprising:
a receiver node to receive information from a transmitter node, said receiver node comprising:
a clipping ratio estimation module to determine parameters of non-linearity of a transmitter at said receiver node;
a training signal predistortion block to generate predistorted training symbols at said receiver node using said parameters of non-linearity;
a channel equalization block to performing linear equalization at said receiver node using said predistorted training symbols; and
a constellation correction block to correct data symbols in a frequency domain.

2. The apparatus of claim 1, wherein said parameters of non-linearity comprise a clipping ratio of an envelope limiter of said transmitter node.

3. The apparatus of claim 1, wherein said parameters of non-linearity are included within a header of a packet transmitted to said receiver node.

4. The apparatus of claim 1, wherein said parameters of non-linearity are estimated at said receiver node by processing a received signal.

5. The apparatus of claim 1, wherein said parameters of non-linearity comprise coefficients of polynomial expansion of the power amplifier transfer function.

6. The apparatus of claim 1, wherein said training symbols comprise training Orthogonal Frequency Division Multiplexing symbols.

7. A system, comprising:
an antenna;
a receiver node to couple to said antenna, said receiver node comprising:
a clipping ratio estimation module to determine parameters of non-linearity of a transmitter at said receiver node;
a training signal predistortion block to generate predistorted training symbols at said receiver node using said parameters of non-linearity;
a channel equalization block to perform linear equalization at said receiver node using said predistorted training symbols; and
a constellation correction block to correct data symbols in a frequency domain.

8. The system of claim 7, wherein said parameters of non-linearity comprise a clipping ratio of an envelope limiter of said transmitter node.

9. The system of claim 7, wherein said parameters of non-linearity are included within a header of a packet transmitted to said receiver node.

10. The system of claim 7, wherein said parameters of non-linearity are estimated at said receiver node by processing a received signal.

11. The system of claim 7, wherein said parameters of non-linearity comprise coefficients of polynomial expansion of the power amplifier transfer function.

12. The system of claim 7, wherein said training symbols comprise training Orthogonal Frequency Division Multiplexing symbols.

13. A method, comprising:
receiving information from a transmitter node at a receiver node;
determining parameters of non-linearity of said a transmitter at said receiver node;
predistorting training symbols at said receiver node;
performing linear equalization at said receiver node using predistorted training symbols; and
correcting data symbols in a frequency domain using constellation correction coefficients.

14. The method of claim 13, further comprising receiving said parameters of non-linearity within a header of a packet transmitted to said receiver node.

15. The method of claim 13, further comprising estimating said parameters of non-linearity at said receiver node by processing a received signal.

16. The method of claim 13, further comprising determining said parameters of non-linearity by using coefficients of polynomial expansion of the power amplifier transfer function.

17. An article comprising a non-transitory machine-readable storage medium containing instructions that if executed enable a system to:
receive information from a transmitter node at a receiver node;
determine parameters of non-linearity of said a transmitter at said receiver node;
predistort training symbols at said receiver node;
perform linear equalization at said receiver node using predistorted training symbols; and
correct data symbols in a frequency domain using constellation correction coefficients.

18. The article of claim 17, further comprising instructions that if executed enable the system to receive said parameters of non-linearity within a header of a packet transmitted to said receiver node.

19. The article of claim 17, further comprising instructions that if executed enable the system to estimate said parameters of non-linearity at said receiver node by processing a received signal.

20. The article of claim 17, further comprising instructions that if executed enable the system to determining said parameters of non-linearity by using coefficients of polynomial expansion of the power amplifier transfer function.

* * * * *